US006175729B1

(12) United States Patent
He et al.

(10) Patent No.: US 6,175,729 B1
(45) Date of Patent: Jan. 16, 2001

(54) WRIST BAND WITH EMBEDDED ANTENNA

(75) Inventors: Zhujun He, Suwa; Tomozumi Saruwatari; Dai Terasawa, both of Chiba, all of (JP)

(73) Assignees: Seiko Epson Corporation, Tokyo; Seiko Instruments Inc., Chiba-ken, both of (JP)

( * ) Notice: Under 35 U.S.C. 154(b), the term of this patent shall be extended for 0 days.

(21) Appl. No.: 09/046,708

(22) Filed: Mar. 24, 1998

(30) Foreign Application Priority Data

Mar. 25, 1997 (JP) .................................................. 9-072205

(51) Int. Cl.[7] .................................................... H05K 11/00

(52) U.S. Cl. ........................... 455/344; 455/90; 455/274; 455/351; 343/718; 343/720; 343/788

(58) Field of Search .................................... 455/344, 279, 455/280, 348, 351, 80, 274, 575; 343/718, 720, 788; 340/825.44

(56) References Cited

U.S. PATENT DOCUMENTS

| | | | | |
|---|---|---|---|---|
| 4,545,095 | * | 10/1985 | Fontana | 24/71 |
| 4,546,522 | * | 10/1985 | Gygax | 24/71 |
| 4,922,260 | * | 5/1990 | Gaskill et al. | 343/718 |
| 4,977,614 | * | 12/1990 | Kurchart | 455/344 |
| 5,132,697 | * | 7/1992 | Tan | 343/718 |
| 5,134,724 | * | 7/1992 | Gehring et al. | 455/274 |
| 5,135,694 | | 8/1992 | Akahane et al. | 264/138 |
| 5,152,693 | | 10/1992 | Matsui et al. | 439/37 |
| 5,168,281 | | 12/1992 | Tokunaga | 343/718 |
| 5,179,733 | | 1/1993 | Matsui | 455/344 |
| 5,303,421 | * | 4/1994 | Goldenberg | 455/344 |
| 5,742,256 | * | 4/1998 | Wakabayshi | 343/718 |

* cited by examiner

*Primary Examiner*—Fan Tsang
*Assistant Examiner*—Blane S. Jackson
(74) *Attorney, Agent, or Firm*—Oliff & Berridge, PLC

(57) ABSTRACT

A wrist band for a device main body containing communication circuits, having a first wrist band at least partially covering a first antenna plate, a second wrist band at least partially covering a second antenna plate, and a clasp device including a contact mechanism for electrically connecting the first antenna plate and the second antenna plate to form a loop-like antenna when the second wrist band and first wrist band are clasped. The clasp device is releasable and has a three-fold stricture. The clasp device includes a clasp lower plate having a base end portion fixed to the first wrist band, a clasp intermediate plate connected to the clasp lower plate, a clasp upper box connected to the clasp intermediate plate and fixed to the second wrist band and a clasping lock mechanism that fixes the clasp upper box to the clasp lower plate when the clasp intermediate plate is rotated and overlapped onto the clasped lower plate. The contact mechanism includes a bare portion of the second antenna plate on an inner peripheral surface of the second wrist band and a projecting contact portion projecting from a top surface of the clasp lower plate and electrically connected with the first antenna plate, the projecting contact portion contacting the bare portion of the second antenna plate when the first wrist band and the second wrist band are clasped.

17 Claims, 13 Drawing Sheets

WRIST BAND WITH EMBEDDED ANTENNA

BACKGROUND OF THE INVENTION

1. Field of Invention

The present invention relates to a wrist-fit type communication device having the function of receiving and transmitting communication radio waves. More particularly, the present invention relates to a clasp structure of two wrist bands which are integrated with two antenna sheets, respectively, for forming a loop-like antenna when fitted to a wrist.

2. Description of Related Art

As portable transmitters or receivers, wristwatches with FM radios and wristwatch-type individual select call receivers have been known. In these portable communication devices, a wristwatch-type wrist-fitting communication device includes, as shown in FIG. 15(A), a device main body 2C containing communication circuits; a first wrist band 3C covering a first antenna plate 30C, extending from the 6 o'clock side of a wristwatch of the device main body 2C, with a flexible insulating material; and a second wrist band 4C covering a second antenna plate 40C, extending from the 12 o'clock side, with a flexible insulating material. In addition, a clasp metal fitting main body 5C electrically connected to the first antenna plate 30C, and clasping hook metal fitting 6C are fixed to the end portion of the first wrist band 3C and a predetermined position of the second wrist band 4C, respectively, as shown in FIGS. 15 (B) and 15(C). When the first wrist band 3C and the second wrist band 4C are clasped, the first antenna plate 30C and the second antenna plate 40C are electrically connected by these metal fittings.

Since the described clasp device is widely adopted for common watches, a detailed description thereof will be omitted. When the hook metal fitting 6C is rotated around the axis of a connecting shaft 62C so that it is overlapped onto the clasp metal fitting main body 5C, after a hooking portion 61C of the hook metal fitting 6C has been hooked on one engagement shaft 51C of two engaging shafts included in the clasp metal fitting main body 5C, a catch portion 63C of the hook metal fitting 6C catches the other engagement shaft 52C of the clasp metal fitting main body 5C while it is elastically deformed, so that the first wrist band 3C and the second wrist band 4C are clasped.

As a result, the first antenna plate 30C is electrically connected to the second antenna plate 40C through the connecting shaft 62C, the hook metal fitting 6C, the catch portion 63C, the engagement shaft 52C, and the clasp metal fitting main body 5C. In addition, if a presser plate 54C supported by the engagement shaft 53C on the side of the clasp metal fitting main body 5C is raised, the clasp metal fitting main body 5C can be slid on the first wrist band 3C, so that the length of the band can be adjusted to the circumference of a user's wrist. At this time, since recessed portions 301C are formed on the inner peripheral surface in the longitudinal direction of the first wrist band 3C where the first antenna plate 30C is bare at predetermined intervals, if the clasp metal fitting main body 5C is shifted to the position where positioning projections 55C of the clasp metal fitting main body 5C are fitted to any of these recessed portions 301C and thereafter, and the presser plate 54C is folded, the clasp metal fitting main body 5C is returned to a state where it is fixed to the first wrist band 3C because a band presser pawl (not shown) is formed on the presser plate 54C. In this state, the positioning projections 55C are electrically connected to the first antenna plate 30C in the recessed portions 301C, so that the first antenna plate 30C and the clasp metal fitting main body 5C are electrically connected.

However, although the conventional wrist-fit-type communication device is of a type in which two separate wrist bands are connected through the clasp metal fitting main body 5C and the hook metal fitting 6C, the first antenna plate 30C and the second antenna plate 40C are integrated with the first wrist band 3C and the second wrist band 4C, respectively, and these antenna plates are covered with thick synthetic resin so as not to injure a user's wrist. Thus, the first wrist band 3C and the second wrist band 4C have poor flexibility compared with bands included in common wristwatches. For this reason, when the second wrist band 4C is to be drawn after the device main body 2C has been placed on the wrist and the first wrist band 3C has been wound around the wrist, the second wrist band 4C does not hang over the wrist but remains extended horizontally, so that the user's fingers cannot easily reach the second wrist band 4C, whereby the problem of poor fitting to the wrist is encountered.

In consideration of the problems described above, an object of the present invention is to provide a wrist-fit-type communication device including two antenna plates integrated with the wrist band, respectively, wherein the fitting property to a wrist can be improved.

In addition, an object of the present invention is to provide a wrist-fit-type communication device including a contact mechanism capable of electrically connecting the two antenna plates with certainty even when the fitting to the wrist is improved.

SUMMARY OF THE INVENTION

In order to solve the problems, according to the present invention, there is provided a wrist-fit-type communication device including a device main body containing communication circuits; a first wrist band covering a first antenna plate, extending from one side of either the 6 o'clock side or the 12 o'clock side in a wristwatch of the device main body, with a flexible insulating material; a second wrist band covering a second antenna plate, extending from the other side, with a flexible insulating material; and a clasp device including a contact mechanism for electrically connecting the first antenna plate and the second antenna plate to form a loop-like antenna when the second wrist band and the first wrist band are clasped, wherein the clasp device has a three fold structure including a clasp lower plate of which a base end portion is fixed to the first wrist band; a clasp intermediate plate connected to a tip portion of the clasp lower plate through a first connecting shaft; a clasp upper box connected to a tip portion of the clasp intermediate plate through a second connecting shaft and fixed to the second wrist band; and a clasping lock mechanism which fixes the clasp upper box to the clasp lower plate when the clasp intermediate plate is rotated around the axis of the first connecting shaft and overlapped onto the clasp lower plate, and which can be released from the fixed condition.

According to the present invention, since the three fold clasp device is used for clasping the first wrist band and the second wrist band, the first wrist band and the second wrist band are clasped after passing a wrist through a ring formed by the device main body, the first wrist band, the clasp device, and the second wrist band. Therefore, unlike a case where the conventional separated two wrist bands are used, there is no inconvenience such that the wrist-fit-type communication device undesirably falls off of the wrist. Especially, since the first antenna plate and the second antenna plate are contained, and they are covered with the insulating materials, even when the first wrist band and the second wrist band are relatively hard, an operation of drawing the first wrist band after winding the second wrist band around the wrist is not required unlike the wrist band of two separated band-type, so that there is an advantage that the wrist bands can be easily fitted to the wrist.

In the present invention, synthetic resin, leather, nylon, synthetic leather, cloths, and so forth can be used as the insulating material for covering the antenna plates in the wrist bands. When the antenna plate is covered with synthetic resin as the insulating material, there is an advantage that the wrist band can be manufactured integrally with the antenna plate. If such an insulating material formed of synthetic resin is used, the wrist band is further likely to become inflexible. However, since the three fold clasp device is adopted for the present invention, the fit to the wrist is comfortable and secure. Therefore, the most use can be made of the advantage of using synthetic resin as the insulating material.

In the present invention, the contact mechanism may preferably include a bare portion of the second antenna plate formed on the inner peripheral surface of the second wrist band, and a projecting contact portion which projects on the top surface of the clasp lower plate in a condition of electrically connected to the first antenna plate, and comes into abutment with the bare portion of the second antenna plate to be electrically connected thereto when the first wrist band and the second wrist band are clasped. In this case, a slot may be preferably formed in the clasp intermediate plate at the position of overlapping the projecting contact portion when the first wrist band and the second wrist band are clasped, and the projecting contact portion may preferably pass through the slot to come into abutment with the bare portion of the second antenna plate. When the three fold clasp device is adopted, the clasp intermediate plate is provided between the first wrist band and the second wrist band. Thus, there may be a construction in which the projecting contact portion is arranged at the position avoiding the clasp intermediate plate so as to be abutment with the bare portion of the second antenna plate. In contrast, if a slot is formed in the clasp intermediate plate so that the projecting contact portion comes into contact with the second antenna plate passing through the slot, restrictions on the position of the projecting contact portion, etc. are relaxed, so that the reduction of the size of the clasp lower plate, etc. can be achieved.

When constructed as described above, the projecting contact portion may be preferably urged by a contact urging spring so as to elastically come into contact with the bare portion of the second antenna plate. By this construction, since the projecting contact portion is urged by the spring it is electrically connected to the second antenna plate with certainty even if a looseness and a reduction in dimensional accuracy are produced in any part of the clasp device.

In the present invention, there may be a case where the projecting contact portion is constructed as a part of the contact urging spring, and this structure can reduce the number of components.

In the present invention, a protective cover for covering the contact urging spring may be preferably formed on the upper surface of the clasp lower plate so that the projecting contact portion projects from the upper surface of the protective cover. By this construction, since the contact urging spring is covered with the protective cover and is not bare, user's hands and other objects do not touch the contact urging spring to deform it. Therefore, the projecting contact portion is urged by the contact urging spring so as to be electrically connected to the second antenna plate with certainty. In addition, the contact urging spring does not injure the user's wrist and so forth.

In the present invention, from the viewpoint of positively utilizing the use of the three fold structure, the bare portion of the second antenna plate may be preferably formed to the extent that it does not stick out of the tip side of the clasp lower plate when the clasp intermediate plate is overlapped onto the clasp lower plate. By this construction, of the bare portion of the second antenna plate, the portion located on the tip side of the second wrist band is completely concealed by the first wrist band, and the bare portion located on the base end side of the second wrist band is concealed by the clasp lower plate when the clasp intermediate plate is overlapped onto the clasp lower plate to clasp the wrist bands. Therefore, even if the second antenna plate is partially bare, the bare portion is completely concealed when the wrist bands are clasped. Thus, even when fitted to the wrist, the skin does not touch the bare portion of the second antenna plate, so that a good feeling of fitting can be provided. In addition, since the bare portion of the second antenna plate is not stained, there causes no poor electrical connection when the length of the band is adjusted even if electrical connection is effected at a portion which has not been used for the electrical connection.

In the present invention, the clasp upper box may preferably include a clasp upper box-fixing lock mechanism which can adjust a clamped condition of the second wrist band, and the fixed position of the clasp upper box in the longitudinal direction of the second wrist band by releasing the clamped condition, whereby the length of the band can be adjusted.

In this case, a plurality of dents may be preferably formed on the inner peripheral surface in the longitudinal direction of the second wrist band at predetermined intervals, and the clasp upper box-fixing lock mechanism may preferably include engagement projections which are engaged with any of the dents to prevent a shift of the clasp upper box on the second wrist band.

In addition, the dents may be preferably formed in the longitudinal direction of the second wrist band at fixed intervals, and the clasp upper box may preferably include index marks for performing alignment of the engagement projections and the dents with which the dents should be engaged on the basis of other dents when bringing predetermined dents of the plurality of dents into engagement with the engagement projections. When the fixed position of the clasp upper box with respect to the wrist band is intended to adjust, the dents for engaging therewith the engagement projections are concealed and invisible, so that the adjustment may require much labor. As the present invention, however, if the alignment is performed between other dents and the positioning index marks by utilizing the fact that the dents are formed at fixed intervals so as to enable even an indirectly alignment of the engagement projections and the dents with which the engagement projections should be engaged, the alignment can be easily performed.

In the present invention, of components constituting the clasp upper boxfitting lock mechanism and the clasping lock mechanism, the components formed on the side of the clasp upper box may be preferably constructed in one piece as a lock unit.

In the present invention, the clasping lock mechanism may preferably have a hook raising at the top surface of the clasp lower plate, and an engagement piece which is automatically engaged with the hook on the lower surface of the clasp upper box with elasticity due to engaging springs when the clasp upper box is pressed toward the clasp lower plate with the clasp intermediate plate overlapped onto the clasp lower plate, and the engagement piece may be preferably displaced against urging forces of the engaging springs so as to be disengaged from the hook when an external operation for releasing the engagement with the hook is performed.

In this case, for example, the clasping lock mechanism may preferably have two engagement plates as the engagement piece including outer end portions each projected from the opposite side of both side surfaces of the clasp upper box, and inner end portions passing around from the outer end portions to the opposite side of the hook to be engaged with the hook at the opposite side, and the two engagement plates may be preferably urged by the engaging springs toward the respective outer end portions, whereby the inner end portions are elastically engaged with the hook, displaced against urging forces of the engaging springs when the outer end portions are pressed by both side surfaces of the clasp upper box, and disengaged from the hook. This construction allows the engagement plates to be disengaged from the hook by simply pushing the outer end portions of the engagement plates when grasping the both side surfaces of the clasp upper box, so that the clasping can be easily released.

Here, the inner end portions may be preferably constructed so as to pass around to the opposite side of the hook in the reverse direction to each other, whereby the two engagement plates are arranged two-dimensionally without overlapping. This construction allows the engagement plates to be thin, so that they are suitably arranged in the clasp upper box.

In the present invention, the clasping lock mechanism may have a hook raising on the top surface of the clasp lower plate in the shape bent toward the tip portion of the clasp lower plate, and an engagement plate which is formed on the side of the second wrist band separately from a main body portion of said clasp upper box, and rotatably supported around the axis of the second connecting shaft, and the engagement plate may include an engagement shaft which enters the hook to be engaged with the hook while the engagement plate is rotated around the axis of the second connecting shaft with the clasp intermediate plate overlapped onto the clasp lower plate, and is changed from the raising attitude to the falling-down attitude with respect to the second wrist band, and engaging small projections which are fitted into engagement holes formed in both side surfaces of the clasp lower plate when the engagement plate is pressed toward the clasp lower plate using the engaged portion of the engagement shaft and the hook as a fulcrum after the engagement shaft has been engaged with the hook.

BRIEF DESCRIPTION OF THE DRAWINGS

A complete understanding of the present invention may be obtained by reference to the accompanying drawings, when considered in conjunction with the subsequent detailed description thereof, in which.

DETAILED DESCRIPTION OF PREFERRED EMBODIMENTS

The embodiments of the present invention will now be described with reference to the drawings.

Figure 1:
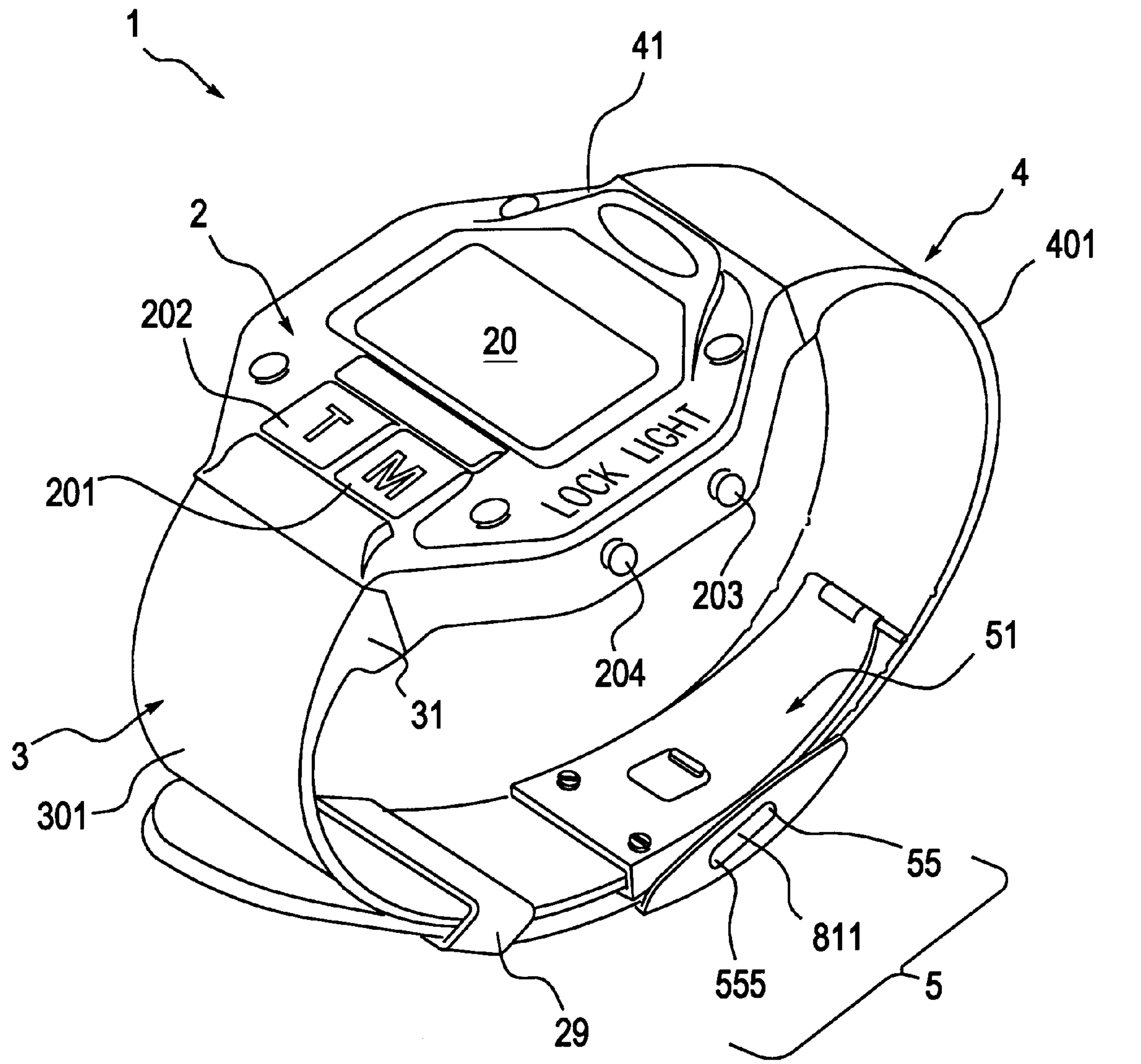
FIG. 1 is an illustration showing an overall configuration of a wrist-fit-type communication device according to a first embodiment of the present invention.
Figure 2:
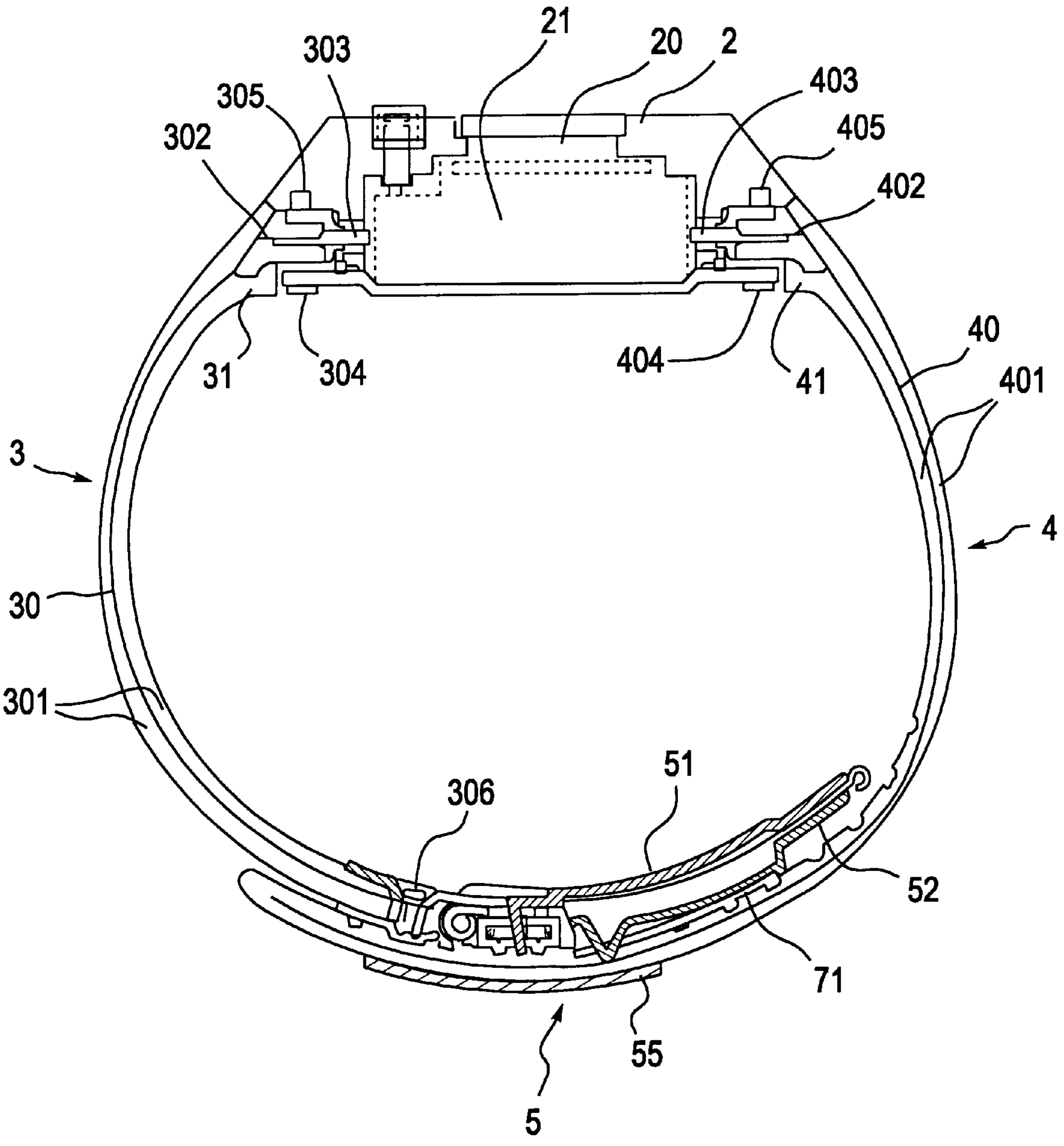
FIG. 2 is a sectional view showing an overall inner structure of the wrist-fittype communication device shown in FIG. 1.

FIG. 1 is an illustration showing an overall configuration of a wrist-fit type communication device of this embodiment; and FIG. 2 is a sectional view showing an overall inner structure of the wrist-fit type communication device.

Referring to FIG. 1, a wrist-fit type communication device 1 consists of a device main body 2, a first wrist band 3 extending from the 6 o'clock side in a wristwatch of the device main body 2, a second wrist band 4 extending from the 12 o'clock side (i.e., from a side opposite the first wrist band 3), and a clasp device 5 for clasping these wrist bands. In addition, a movable retainer 29 for retaining the tip portion of the second wrist band 4 is attached to the first wrist band 3.

The device main body 20 includes a liquid crystal display panel 20 provided on the center of the surface thereof, and two push switches 201 and 202 are arranged on the 6 o'clock side of the liquid crystal display panel. In addition, two push switches 203 and 204 are arranged on the side surface of the 3 o'clock side of the device main body 2.

As shown in FIG. 2, a circuit assembly 21 and a circuit-driving battery of a button type (not shown) are stacked inside the device main body 2. Various electronic components, such as a high-frequency analog IC, a signal processing digital IC, and so forth are mounted to the circuit assembly 21 through a circuit board (not shown), and communication circuits for transmitting and receiving are formed by these electronic components.

The first wrist band 3 and the second wrist band 4 include therein a first metal antenna plate 30 and a second metal antenna plate 40, respectively, and these first and second antenna plates 30 and 40 are covered with insulating materials 301 and 401 formed of synthetic resin. The first wrist band 3 and the second wrist band 4 have thick base end portions 31 and 41 connected to the device main body 2, and in the base end portions 31 and 41, contact pins 303 and 403 are electrically connected to a base end portion 302 of the first antenna plate 30 and a base end portion 402 of the second antenna plate 40, respectively. These contact pins 303 and 403 are electrically connected to the circuit assembly 21 with the first wrist band 3 and the second wrist band 4 connected to the device main body 2 by means of securing pins 305 and 405 and set screws 304 and 404, etc.

Although a detailed description will be given later, the first antenna plate 30 and the second antenna plate 40 are electrically connected through the clasp device 5 with the first wrist band 3 and the second wrist band 4 clasped, and electrically connected to the circuit assembly 21 in the device main body 2, so that a loop-like antenna is formed. Therefore, the wrist-fit type communication 1 can transmit and receive communication radio waves by means of the loop-like antenna using the first antenna plate 30 and the second antenna plate 40.

As the clasp for fitting the device main body 2 to a wrist while forming such a loop-like antenna, a three fold clasp device 5 is employed in this embodiment. The three fold clasp device 5 of this embodiment has the same basic structure as that used for a conventional wristwatch. However, it is necessary to electrically connect the first antenna plate 30 and the second antenna plate 40, so that improvements as described below are made.

Figure 3:
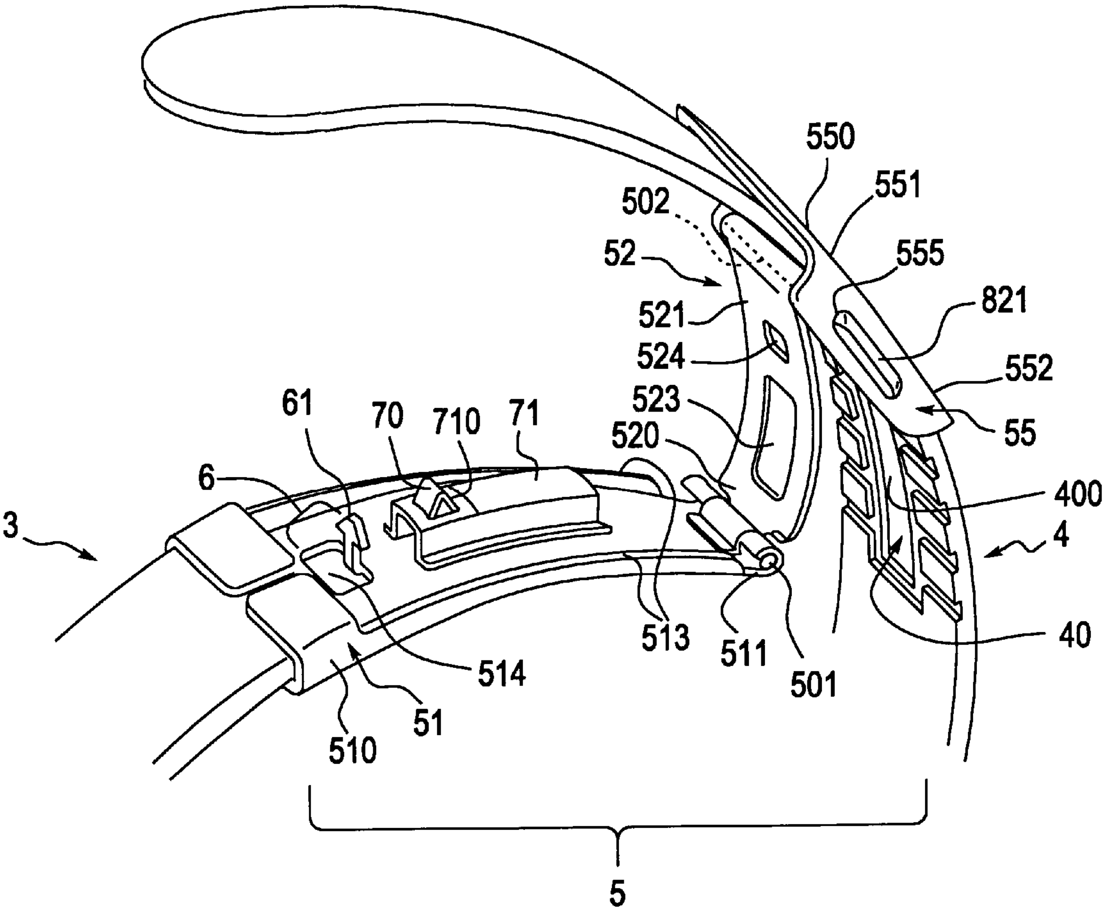
FIG. 3 is a perspective view, as seen diagonally from above, of a clasp device employed in the wrist-fit-type communication device shown in FIG. 1.
Figure 4:
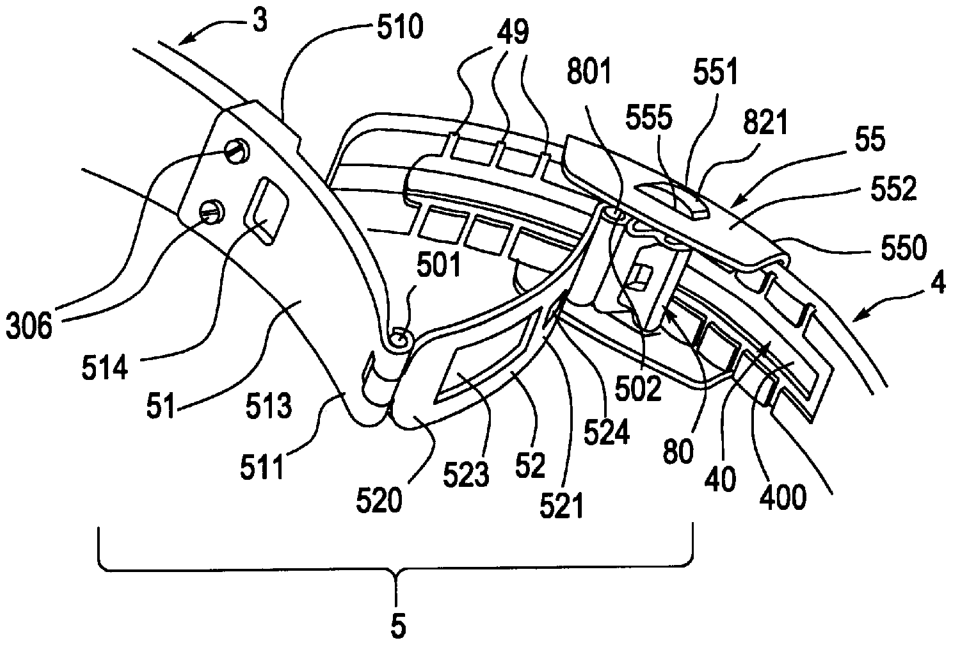
FIG. 4 is a perspective view, as seen diagonally from below, of the clasp device employed in the wrist-fit-type communication device shown in FIG. 1.

FIGS. 3 and 4 are perspective views, as seen diagonally from above and as seen diagonally from below, respectively, of the clasp device employed in the wrist-fit type communication device.

As shown in FIGS. 3 and 4, the clasp device 5 employed in this embodiment consists of a metal clasp lower plate 51 of which a base end portion 510 is fixed to the first wrist band 3, a metal clasp intermediate plate 52 of which a base end portion 520 is connected to a tip portion 511 of the clasp lower plate 51 through a first connecting shaft 501, a metal clasp upper box 55 connected to a tip portion 521 of the clasp intermediate plate 52 through a second connecting shaft 502 and fixed to the second wrist band 4, and a clasping lock mechanism 6 which fixes the clasp lower plate 51 and the clasp upper box 55 when the intermediate clasp 52 is rotated around the axis of the first connecting shaft 501 and overlapped onto the clasp lower plate 51, and which can release the fixture.

The clasp lower plate 51 has a rectangular frame portion formed on the base end portion 510 thereof into which the tip portion of the first wrist band 3 is fitted, and is fixed by two screws 306 secured from the bottom surface thereof so as to be electrically connected to the first antenna plate 30 included in the first wrist band 3 (see FIG. 2). The clasp lower plate 51 is bent upward at both sides 513 from the base end portion 510 to the tip portion 511, and has a high strength.

A rectangular slot 514 is opened at the base end side of the clasp lower plate 51, and a hook 61 of the clasping lock mechanism 6 is raised upward at its edge of the tip side. In addition, a protective cover 71 in the shape of a rectangular prism is fixed by means of welding, etc. at a portion slightly nearer the tip portion than the slot 514, and from a rectangular slot 710 formed in the top surface thereof, a projecting contact portion 70 is projected.

The clasp lower plate 51 and the clasp intermediate plate 52 are connected by two small tubular portions formed by bending both sides of the tip portion 511 of the clasp lower plate 51 into the shape of a ring, a tubular portion formed by bending the center portion of the base end portion of the clasp intermediate plate 52 into the shape of a ring and located between the two tubular portions of the clasp lower plate 51, and the first connecting shaft 501 inserted through these tubular portions, so that the clasp intermediate plate 52 can be rotated around the axis of the first connecting shaft 501. Incidentally, since the first connecting shaft 501 is crushed at its both end portions, it does not come out from the shaft hole formed by the tubular portions.

The clasp intermediate plate 52 has two rectangular slots 523 and 524 formed in the longitudinal direction of the metal plate. Of these two slots 523 and 524, a larger slot 523 located at the base end side of the clasp intermediate plate 52 is used for piercing therethrough the protective cover 71 when the clasp intermediate plate 52 is rotated around the first connecting shaft 501 and folded back so as to overlap onto the clasp lower plate 51. The smaller slot 524 located near the tip side is used for piercing therethrough the hook 61 when the clasp intermediate plate 52 is folded back so as to overlap onto the clasp lower plate 51 as described above.

In contrast with this, on the side of the second wrist band 4, the clasp upper box 55 is fixed at a predetermined longitudinal position. A main body cover 550 of the clasp upper box 55 includes a top surface 551 having a slightly curved shape in the longitudinal direction of the second wrist band 4, and both side surfaces 552 formed by folding downward the top surface at the side edges thereof, and is in a state of covering the second wrist band 4. Here, the clasp upper box 55 includes a lock unit 80 fixed on the both side surfaces 552 so that the second wrist band 40 is sandwiched between the clasp upper box 55 and the main body cover 550.

Figure 5:
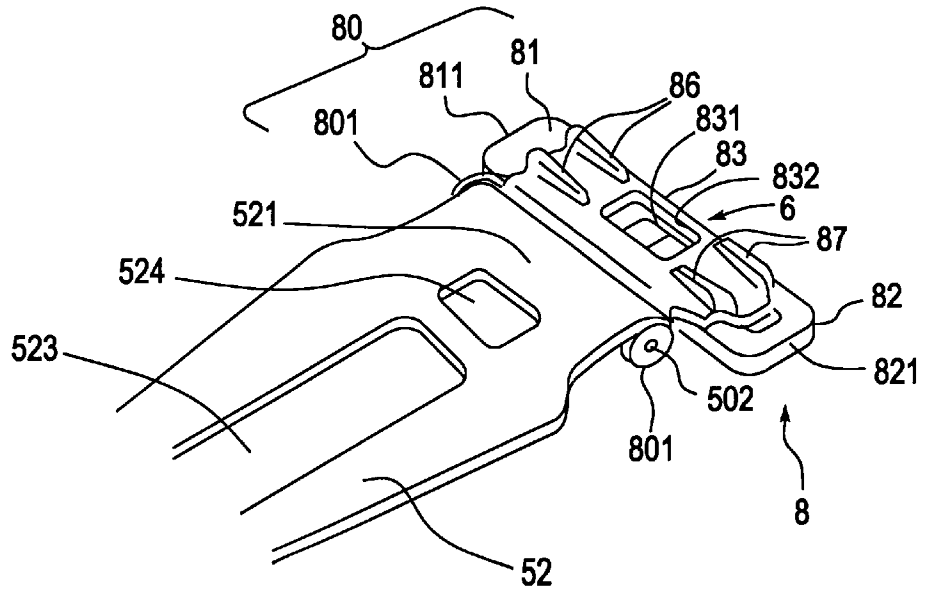
FIG. 5 is a perspective view of a lock unit employed in the wrist-fit-type communication device shown in FIG. 1.

FIG. 5 is a perspective view of the lock unit employed in the wrist-fit-type communication device.

As shown in FIG. 5, the lock unit 80 has two support plates 801 projecting from the end portion located on the tip side in the longitudinal direction of the second wrist band 4, and small holes are formed in these two support plates 801, respectively. On the other hand, since the tubular portion formed by bending the tip portion 521 of the clasp intermediate plate 52 into the shape of a ring is located at the position where it is in communication with the holes of the support plates 801, the clasp intermediate plate 52 and the lock unit 80 are connected through the second connecting shaft 502 by passing the second connecting shaft 502 through the tubular portion and the holes. That is, the clasp intermediate plate 52 and the clasp upper box 55 are connected through the second connecting shaft 502 and the lock unit 80. For this reason, the clasp upper box 55 can be rotated around the axis of the second connecting shaft 502. Therefore, as shown in FIG. 2, all of the clasp lower plate 51, the clasp intermediate plate 52, and the clasp upper box 55 can be folded back at the respective connecting portions, and if folded back in this way, the lower box 51, the clasp intermediate plate 52, and the clasp upper box 55 are overlapped in this order.

Figure 6:
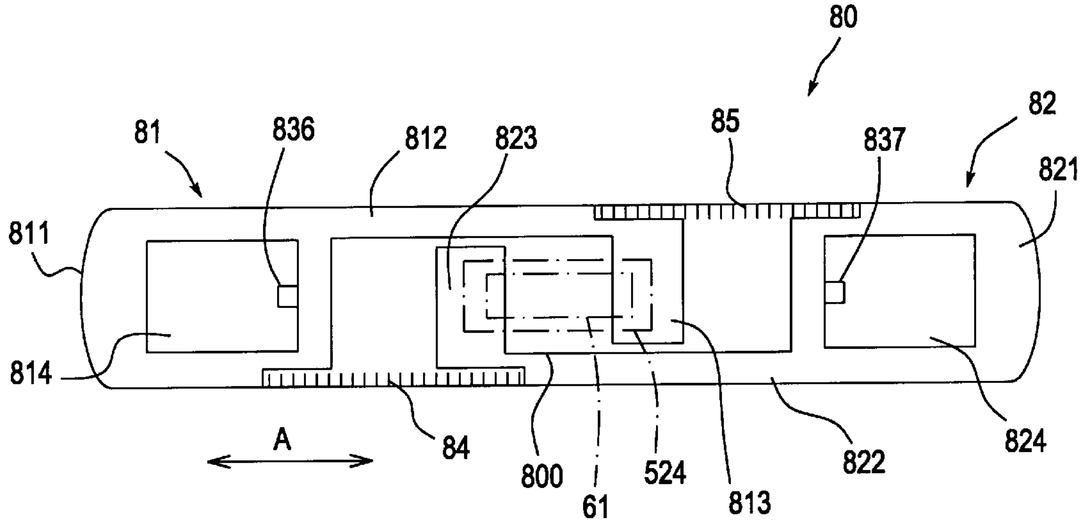
FIG. 6 is a plan view showing configurations of engagement plates and engaging coil springs contained in the lock unit shown in FIG. 5.
Figure 7:
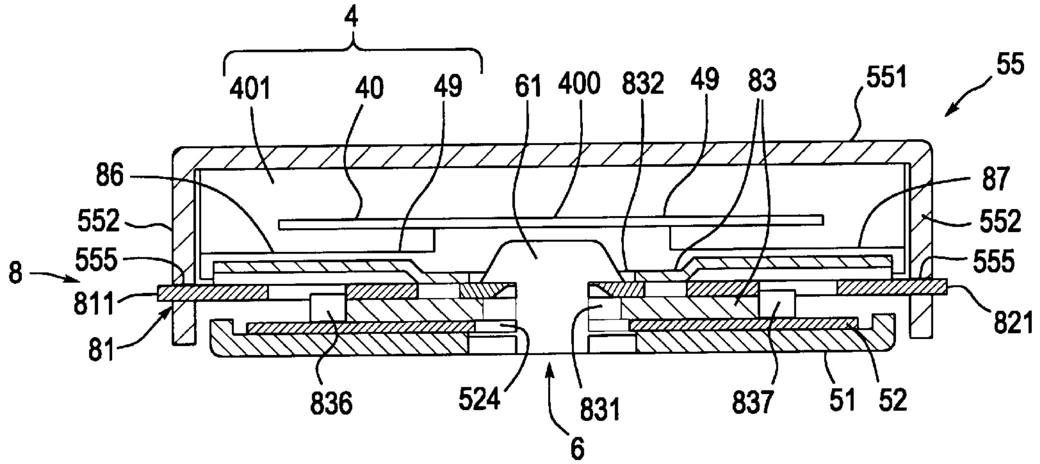
FIG. 7 is a sectional view showing a structure when the lock unit shown in FIG. 5 is mounted to a clasp upper box.

FIG. 6 is a plan view showing configurations of engagement plates and engaging coil springs contained in the lock unit 80, and FIG. 7 is a sectional view showing a structure when the lock unit is mounted to the clasp upper box.

As the clasping lock mechanism 6 for fixing the clasp lower plate 51 and the clasp upper box 55 when the clasp intermediate plate 52 is thus overlapped onto the clasp lower plate 51, engagement plate 81 and 82 (engagement pieces) in the lock unit 80 supported by the clasp upper box 55 on the inner peripheral surface of the second wrist band 4 are employed in this embodiment, as shown in FIGS. 4 and 5 with respect to the hook 61 shown in FIG. 3.

The clasping lock mechanism 6 is, as shown in FIGS. 6 and 7, used for locking the clasp lower plate 51 and the clasp upper box 55 in engagement with the tip portion of the hook 61 when the clasp intermediate plate 52 is overlapped onto the clasp lower plate 51 and the hook passes through the slot of the clasp intermediate plate 52, and a flat rectangular tube-shaped frame 83 of which both sides are opened, two engagement plates 81 and 82 which are arranged inside the frame 83 so that outer end portions 811 and 821 thereof are projected from both sides of the frame 83, and two coil springs 84 and 85 arranged inside the frame 83 between the engagement plates 81 and 82 are employed. In the top surface and the bottom surface of the frame 83, rectangular slots 831 and 832 from which the tip portion of the hook 61 penetrates when the clasp intermediate plate 52 is overlapped onto the clasp lower plate 51 are formed at the positions where they overlap each other.

The two engagement plates 81 and 82 each having the same structure are arranged with both sides thereof inverted from each other, and they are arranged so that a slot 800 from which the hook 61 penetrates when the clasp intermediate plate 52 is overlapped onto the clasp lower plate 51 is formed at the position where it overlaps the slots 831 and 832 of the frame 83. That is, the two engagement plates 81 and 82 include outer end portions 811 and 821 each projected from the opposite side of both side surfaces 552 of the clasp upper box 55, connecting portions 812 and 822 extending straight from the outer end portions 811 and 821 so as to opposingly pass through a position (slot 800) from which the hook 61 appears, and inner end portions 813 and 823 bent inward on the tip side of the connecting portions 812 and 822 to pass around to the opposite side of the position (slot 800) from which the hook 61 appears.

The two engagement plates 81 and 82 are arranged in a longitudinally (the direction shown by the arrow A) slideable condition in the frame 83, and the engaging coil springs 84 and 85 urge the two engagement plates 81 and 82 toward the respective outer end portions. Therefore, although the two engagement plates are urged by the engaging coil springs 84 and 85 in the direction in which the inner end portions 813 and 823 approach each other, stoppers 836 and 837 raised on the side of the bottom surface of the frame 83 are in abutment with the inner peripheries of the rectangular slots 814 and 824 formed in the engagement plates 81 and 82, so that the inner end portions 813 and 823 are prevented from approaching further. For this reason, the slot 800 from which the hook 61 always penetrates is formed with a fixed width size between the inner end portions 813 and 823 of the two engagement plates 81 and 82.

The outer end portions 811 and 812 are always projecting from both sides of the frame 83 by a fixed length, and the outer end portions 811 and 812 can be put inside the frame 83 if they are pushed from both sides.

Thus, in this embodiment, in fixing the lock unit 80 to the clasp upper box 55, rectangular slots 555 are formed in both side portions 552 of the clasp upper box 55, and after inserting the outer end portions 811 and 821 of the engagement plates 81 and 82 inside the side surfaces 552 of the clasp upper box 55 while pressing them into the frame 83 on the side of the lock unit 80, the lock unit 80 is shifted, and the outer end portions 811 and 821 are fitted into the slots 555. In this condition, since the outer end portions 811 and 821 of the engagement plates 81 and 82 are slightly projected from both side surfaces 522 of the clasp upper box 55, the engagement plates 81 and 82 are put inside to each other if they are pushed from both sides, so that the slot 800 formed between the inner end portions 813 and 823 is expanded, whereby it can be disengaged from the hook 61.

In addition, in this embodiment, the lock unit 80 is fixed to the clasp upper box 55, whereby the second wrist band 4 is clamped between the main body cover 550 of the clasp upper box 55 and the top surface of the lock unit 80, and the clasp upper box 55 is fixed to a predetermined position of the first wrist band 3. In this condition, although the lock unit 80 is caught by both side surfaces 552 of the clasp upper box 55 through the engagement plates 81 and 82, the lock unit 80 is removed when it is shifted while pressing in the outer end portions 811 and 812 projected from the both side surfaces 552. Therefore, the lock unit 80 can be re-fixed to the clasp upper box 55 after shifting the position of the clasp upper box 55 in the longitudinal direction of the second wrist band 4 so that a correct length of the band is obtained. In this way, in this embodiment, the clasp upper box-fixing lock mechanism 8 is provided which can adjust a condition where the second wrist band 4 is clamped from top and bottom between the lock unit 80 and the main body cover 550 of the clasp upper box 55 by utilizing the two engaging coil springs 84 and 85 contained in the frame 83, the engagement plates 81 and 82 urged by these engaging coil spring 84 and 85, and the slots 555 formed in both side surfaces 552 of the clasp upper box 55, and the fixed position of the clasp upper box 55 in the longitudinal direction of the second wrist band 4 by releasing the clamped condition. Therefore, it can be said that of the components constituting the clasp upper box-fixing lock mechanism 8 and the clasping lock mechanism 6, the components provided on the side of the clasp upper box 55 are constructed as one lock unit 80.

A plurality of dents 49 are formed on the inner peripheral surface in the longitudinal direction of the second wrist band 4 at fixed intervals, and on the side of the clasp upper box-fixing lock mechanism 8, engagement projections 86 and 87 engaged with any of the dents 49 to prevent the shift of the clasp upper box 55 are formed by two lines on both left and right of the top surface of the frame 83 which constitutes the lock unit 80. Therefore, the lock unit 80 is mounted to the main body cover 550 of the clasp upper box 55 while adjusting relative positions between the lock unit 80 and the second wrist band 4 so that the two lines of engagement projections 86 and 87 are engaged with the dents 49.

Figure 8:
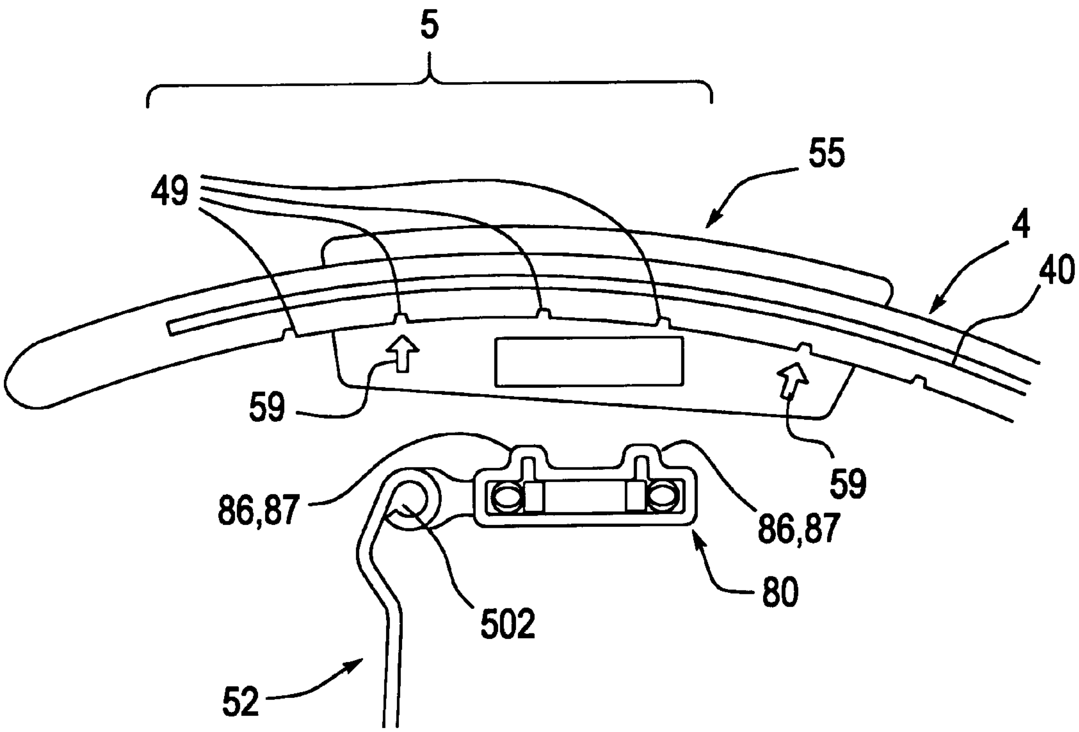
FIG. 8 is an illustration of index marks for use in positioning when the lock unit shown in FIG. 5 is remounted to the clasp upper box.

In order to facilitate the described position adjustment, index marks 59 for performing alignment of the engagement projections 86 and 87 and the dents 49 with which the engagement projections 86 and 87 should be engaged on the basis of other dents 49 when bringing predetermined ones of the plurality of dents 49 into engagement with the engagement projections 86 and 87 are formed at two places on both sides of the slots 555 in the inner peripheral surfaces of the side surfaces 552 of the main body cover 550 of the clasp upper box 55, as shown in FIG. 8.

Therefore, when the fixed position of the clasp upper box 55 with respect to the second wrist band 4 is intended to be adjusted, the dents 49 for engaging therewith the engagement projections 86 and 87 are concealed by the lock unit 80 and invisible, so that the adjustment may require much labor. In this embodiment, however, it is convenient if the alignment is performed between other dents 49 and the positioning index marks 59 by utilizing the fact that the dents 49 are formed at fixed intervals, so as to enable even indirectly the alignment of the engaging projections 86 and 87 and the dents 49 with which the engagement projections 86 and 87 should be engaged.

Figure 9:
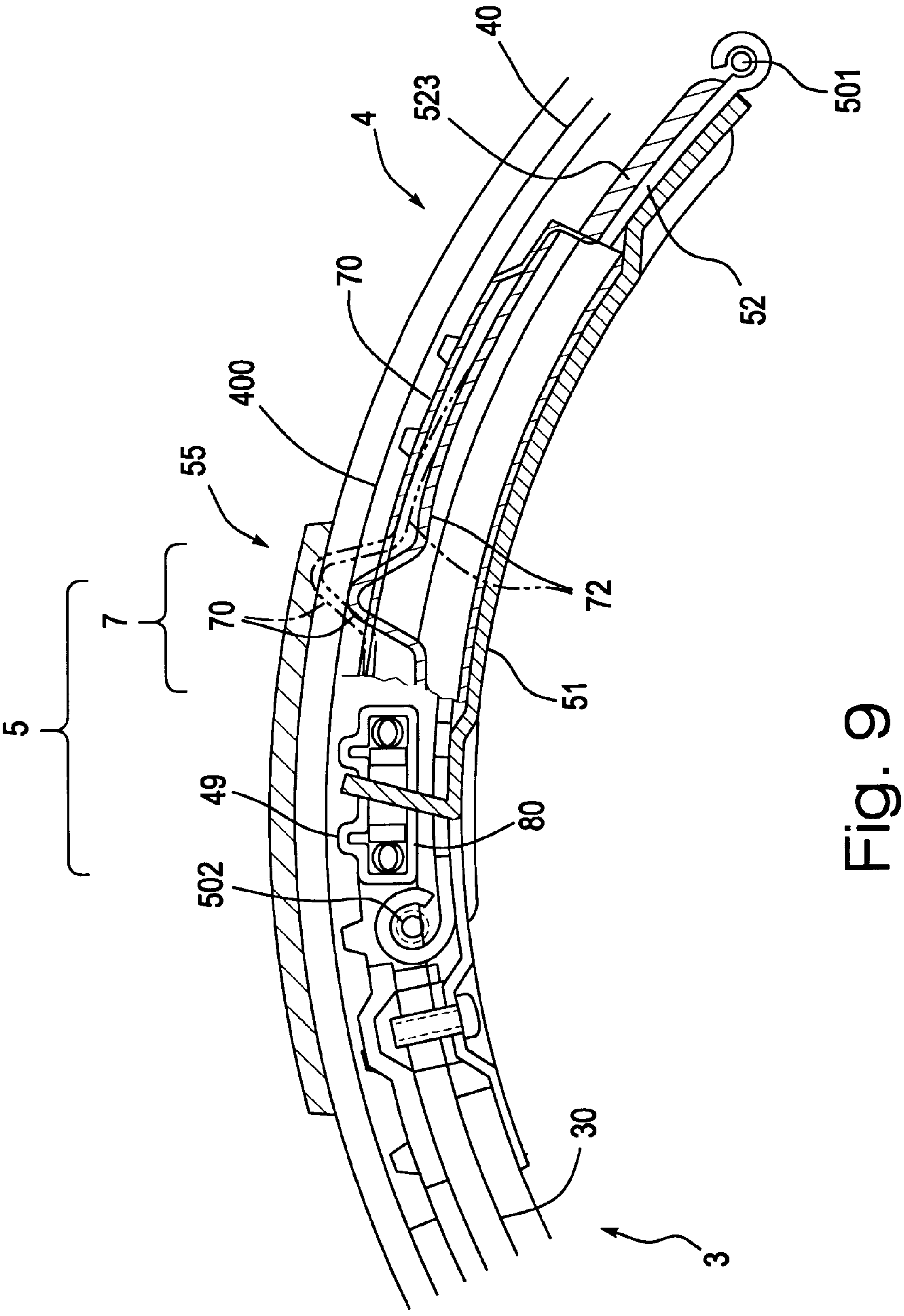
FIG. 9 is a sectional view showing a state where clasping of the wrist bands is finished with the use of the clasp device shown in FIG. 3.

The thus constructed clasp device 5 includes a contact mechanism 7 for electrically connecting the first antenna plate 30 and the second antenna plate 40 when the first wrist band 3 and the second wrist band 4 are clasped to form a loop-like antenna. A mechanism having a construction in which the second antenna plate 40 is bare on the inner peripheral surface in the longitudinal direction of the second wrist band 4, and a projecting contact portion 70 projecting from the top surface of the protective cover 71 comes into contact with a bare portion 400, as shown by one-dot chain line in FIG. 9 is adopted as the contact mechanism 7. Here, the projecting contact portion 70 is constructed as a part of a metal plate spring which constitutes a contact urging spring 72, and the part of the plate spring is accommodated in the protective cover 71.

In this embodiment, the bare portion 400 of the second antenna plate 40 is formed to the extent that it does not stick out of the tip side of the clasp lower plate 51 when the clasp intermediate plate 52 is overlapped onto the clasp lower plate 51 and clasped.

When the contact mechanism 7 is included in the three fold clasp device 5, since the clasp intermediate plate 52 is provided between the first wrist band 3 and the second wrist band 4, it becomes difficult to electrically connect the first antenna plate 30 and the second antenna plate 40 with certainty. In this embodiment, however, the slot 523 is formed in the clasp intermediate plate 52 at the position corresponding to the projecting contact portion 70 and the protective cover 71 when the clasp intermediate plate 52 is overlapped onto the clasp lower plate 51, and the projecting contact portion 70 and the protective cover 71 pass through the slot 523, whereby the projecting contact portion 70 and the bare portion 400 are electrically connected with elasticity. Therefore, the first antenna plate 30 and the second antenna plate 40 can be electrically connected with certainty without changing the basic structure of the three fold clasp device 5. In addition, since there is little restriction on the position of the projecting contact portion 70, the clasp lower plate 51 can be reduced in size.

Moreover, the projecting contact portion 70 is urged by the contact urging spring 72 and elastically comes into abutment with the bare portion 400 of the second antenna plate 40, the projecting contact portion 70 can be electrically connected to the second antenna plate 40 with certainty even if the clasp device 5 has a looseness and a portion of low dimensional accuracy. In addition, the projecting contact portion 70 is constructed as a part of a metal plate spring used as the contact urging spring 72, so that the number of components can be reduced. If the plate spring is used as the contact urging spring 72, a large urging force can be obtained with the thinness thereof, so that it is suitably incorporated into the clasp device 5. Further, since the contact urging spring 72 is covered with the protective cover 71 and is not bare, the user's hands and other objects do not touch the contact urging spring 72 to deform it. Therefore, the projecting contact portion 70 is urged by the contact urging spring 72 so as to be electrically connected to the second antenna plate 40 with certainty, and the contact urging spring 72 does not injure to the user's wrist and so forth.

In the thus constructed wrist-fit-type communication device 1, when it is fitted to a wrist, the three fold clasp device 5 is used for clasping the first wrist band 3 and the second wrist band 4, so that the first wrist band 3 and the second wrist band 4 are connected through the clasp device 5. Therefore, when the wrist-fit-type communication device 1 is fitted to the wrist, the clasp intermediate plate 52 is overlapped onto the clasp lower plate 51 after passing the wrist through a ring formed by the device main body 2, the first wrist band 3, the clasp device 5, and the second wrist band 4. Thereafter, if the clasp upper box 55 is pressed toward the clasp lower plate 51, the hook 61 raised on the top surface of the clasp lower plate 51 passes through the slot 524 of the clasp intermediate plate 52, and penetrates a slot 831 formed in the bottom surface of the lock unit 80, the slot 800 formed by the engagement plates 81 and 82, and a slot 832 formed in the top surface of the lock unit 80. At this time, the engagement plates 81 and 82 are pushed to the outside when the tip portion of the hook 61 passes through the slot 800, but after the tip portion has passed, they are returned toward the original positions by urging forces of the engaging coil springs 84 and 85 and are engaged with the hook 61, whereby the first wrist band 3 and the second wrist band 4 are clasped. At this time, the projecting contact portion 70 projecting from the protective cover on the top surface of the clasp lower plate 51 is elastically in abutment with the second antenna plate 40 which is bare on the inner peripheral surface of the second wrist band 4, so that the first antenna plate 30 and the second antenna plate 40 are electrically connected through the clasp lower plate 51, the contact urging spring 72 in the protective cover 71, and the projecting contact portion 70 to form a loop-like antenna.

On the other hand, in removing the wrist-fit-type communication device 1 from the wrist, the engagement plates 81 and 82 are disengaged from the hook 61 by simply pushing in the outer end portions 811 and 821 of the engagement plates 81 and 82 projecting from both side surfaces 552 of the clasp upper box 55 when grasping them, so that the clasping can be easily released. The thin engagement plates 81 and 82 are used as the described lock mechanism, and the two engagement plates 81 and 82 are arranged so as to pass around to the opposite side of the hook 61 in the reverse direction to each other, and they are arranged two-dimensionally without overlapping. Therefore, since the lock unit 80 can be thin, it is suitably arranged in the clasp upper box 55. Moreover, the lock unit 80 is made detachable with respect to the clasp upper box 55 using the engagement plates 81 and 82, and the clasp upper box 55 is removed from the second wrist band 4 so as to change the fixed position thereof, so that the length of the band can be adjusted with the small number of components.

Thus, according to the wrist-fit-type communication device 1 of this embodiment, since the three fold clasp device 5 is used for clasping the first wrist band 3 and the second wrist band 4, the clasping is performed after passing a wrist through a ring formed by the device main body 2, the first wrist band 3, the clasp device 5, and the second wrist band 4. Therefore, there is no inconvenience such that the wrist-fit-type communication device 1 falls off of the wrist. Especially, since the first antenna plate 30 and the second antenna plate 40 are contained, and they are covered with a thickish synthetic resin (insulating materials 301 and 401), even when the first wrist band 3 and the second wrist band 4 are relatively hard, an operation of drawing the first wrist band 3 after winding the second wrist band 4 around the wrist is not required, unlike the separate-type wrist band, so that there is an advantage that the wrist bands can be easily fitted to the wrist. Therefore, good use can be made of the advantage of adopting synthetic resin as insulating materials for the first wrist band 3 and the second wrist band 4 such that the first wrist band 3 and the second wrist band 4 are manufactured at low cost by integrally forming the first antenna plate 30 and the second antenna plate 40 with synthetic resin, and that the first antenna plate 30 and the second antenna plate 40 are covered with thickish synthetic resin.

Further, from the viewpoint of positively utilizing the adoption of the three fold clasp device 5, the bare portion of the second antenna plate 40 is formed to the extent that it does not stick out of the tip side of the clasp lower plate 51 when the clasp intermediate plate 52 is overlapped onto the clasp lower plate 51. For this reason, of the bare portion 400 of the second antenna plate 40, the bare portion located on the tip side of the second wrist band 4 is completely concealed by the first wrist band 3, and the bare portion located on the base end side of the second wrist band 4 is concealed by the clasp lower plate 51. Therefore, since the skin does not touch the bare portion of the second antenna plate 40, a good fit can be provided. In addition, since the bare portion 400 of the second antenna plate is not stained, there causes no poor electrical connection when the length of the band is adjusted even if electrical connection is effected at a portion which has not been used for the electrical connection.

Figure 10:
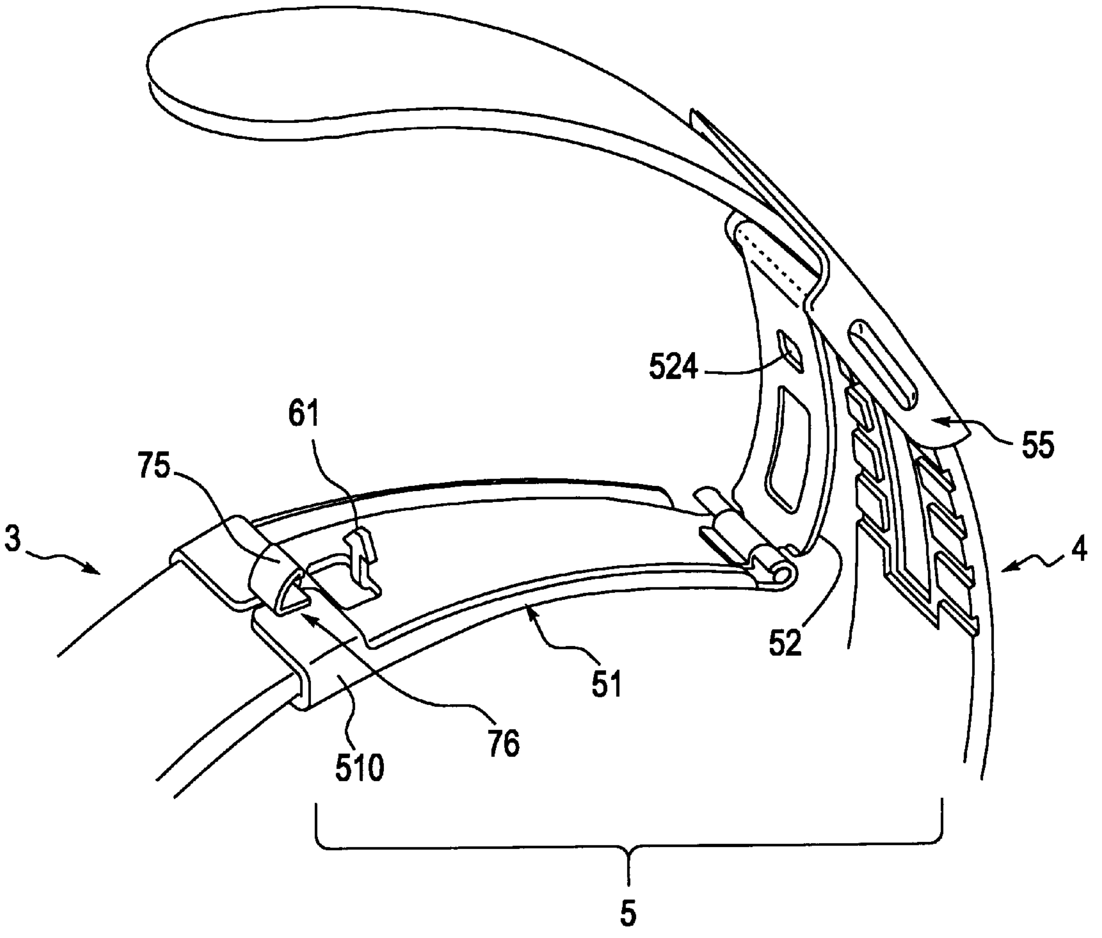
FIG. 10 is a perspective view, as seen from above, of a clasp device employed in a modification of the wrist-fit-type communication device shown in FIG. 1.

FIG. 10 is a perspective view, as seen diagonally from above, of a clasp device employed in a wrist-fit-type communication device according to a modification of the first embodiment.

Incidentally, in the embodiment as described above, in the contact mechanism 7, the protective cover 71 in the shape of a rectangular prism is fixed to the clasp lower plate 51, and the projecting contact portion 70 is projected from the top surface thereof. As shown in FIG. 10, however, a metal contact urging spring 76 may be fixed by a method such as welding to the base end portion 510 of the clasp lower plate 51 connected to the first wrist band 3, and the upper end thereof may be utilized as a projecting contact portion 75. When constructed as described above, the projecting contact portion 75 elastically comes into contact with the bare portion 400 of the second antenna plate 40 by avoiding the clasp intermediate plate 52, and they are electrically connected when the first wrist band 3 and the second wrist band 4 are clasped.

Figure 11:
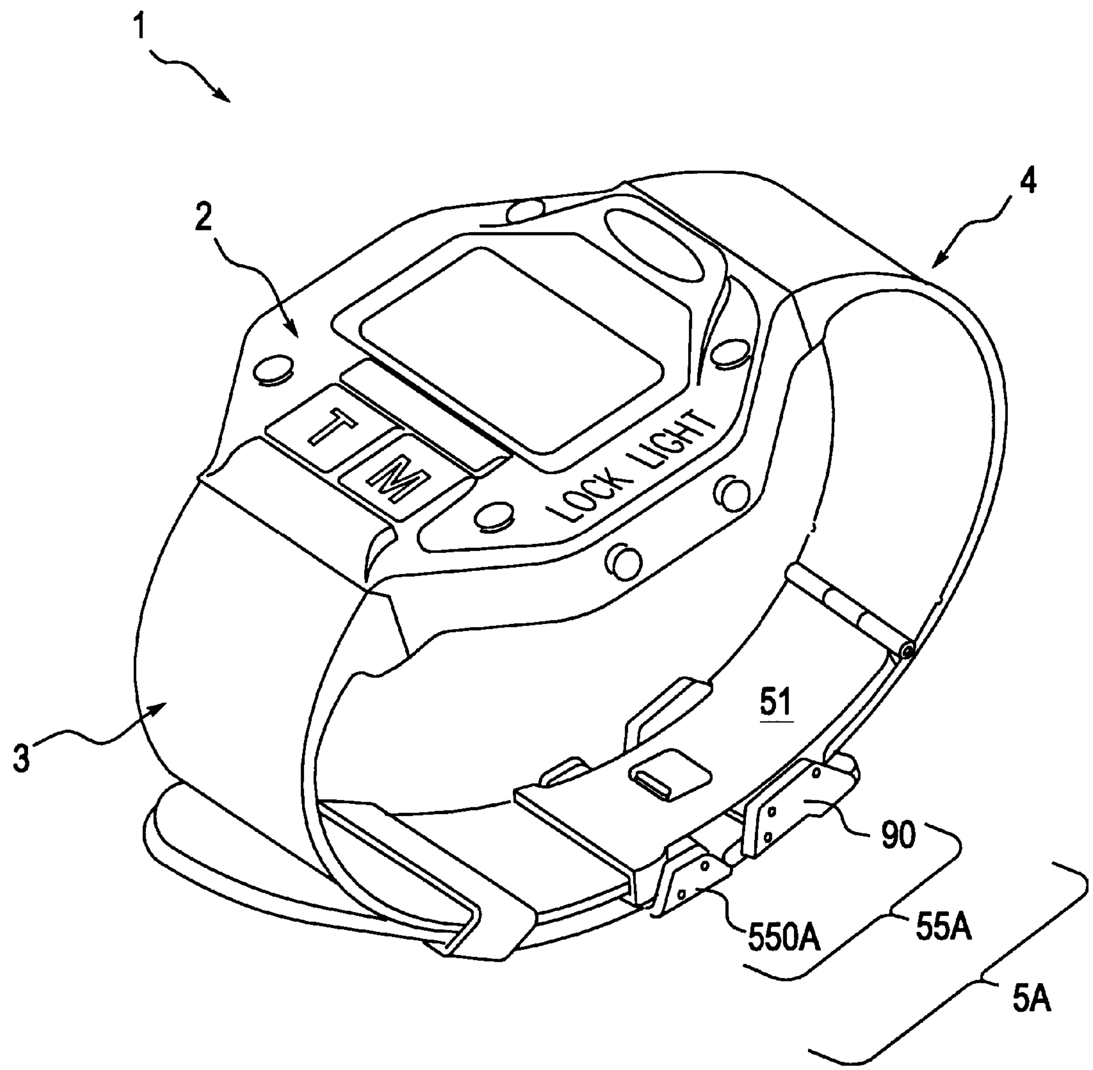
FIG. 11 is an illustration showing an overall configuration of a wrist-fit-type communication device according to a second embodiment of the present invention.
Figure 12:
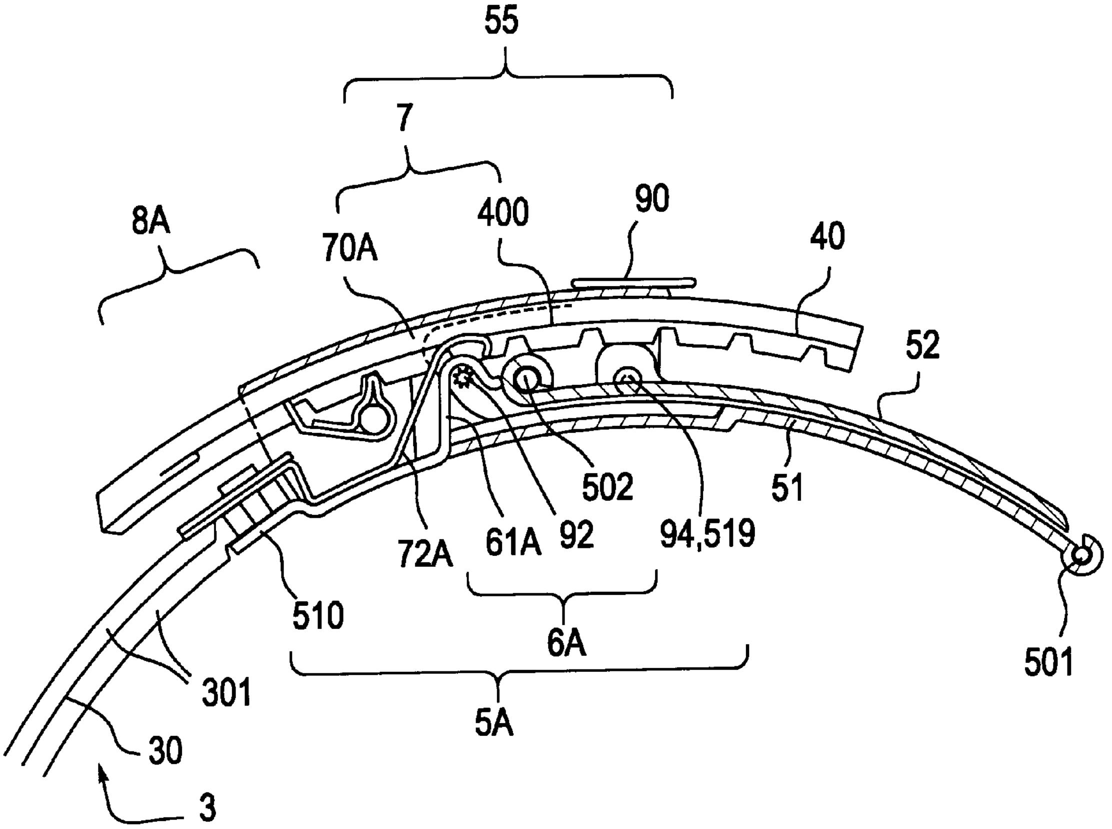
FIG. 12 is a sectional view showing a main part of the wrist-fit-type communication device shown in FIG. 11.

FIG. 11 is an illustration showing an overall configuration of a wrist-fit-type communication device according to the second embodiment of the present invention, and FIG. 12 is a sectional view showing a main part thereof.

Since a wrist-fit-type communication device 1 according to this embodiment has the same basic construction as that of the first embodiment, the corresponding portions are indicated by the same reference numerals, and a description thereof will be omitted. That is, as shown in FIGS. 11 and 12, the wrist-fit-type communication device 1 according to this embodiment is similar to the first embodiment in that it has a clasp device 5A including a device main body 2 containing communication circuits; a first wrist band 3 covering a metal first antenna plate 30 extending from the 6 o'clock side of a wristwatch of the device main body 2, with a flexible insulating material 301 formed of synthetic resin; a second wrist band 4 covering a metal second antenna plate 40, extending from the 12 o'clock side (i.e., a side opposite the first wrist band 3), with a flexible insulating material 401 formed of synthetic resin; and a clasp device 5A including a contact mechanism 7A for electrically connecting the first antenna plate 30 and the second antenna plate 40 to form a loop-like antenna when the second wrist band 4 and the first wrist band 3 are clasped. In addition, the clasp device 5A is similar to the first embodiment in that it has the three fold structure including a clasp lower plate 51 of which the base end portion is adhered to the first wrist band 3, a clasp intermediate plate 52 connected to the tip portion of the clasp lower plate 51 through a first connecting shaft 501, a clasp upper box 55A connected to the tip portion of the clasp intermediate plate 52 through a second connecting shaft 502, and fixed to the second wrist band 4, and a clasping lock mechanism 6A which fixes the clasp upper box 55A to the clasp lower plate 51 when the clasp intermediate plate 52 is rotated around the axis of the first connecting shaft 501 and overlapped onto the clasp lower plate 51, and which can release the fixed condition.

Figure 13:
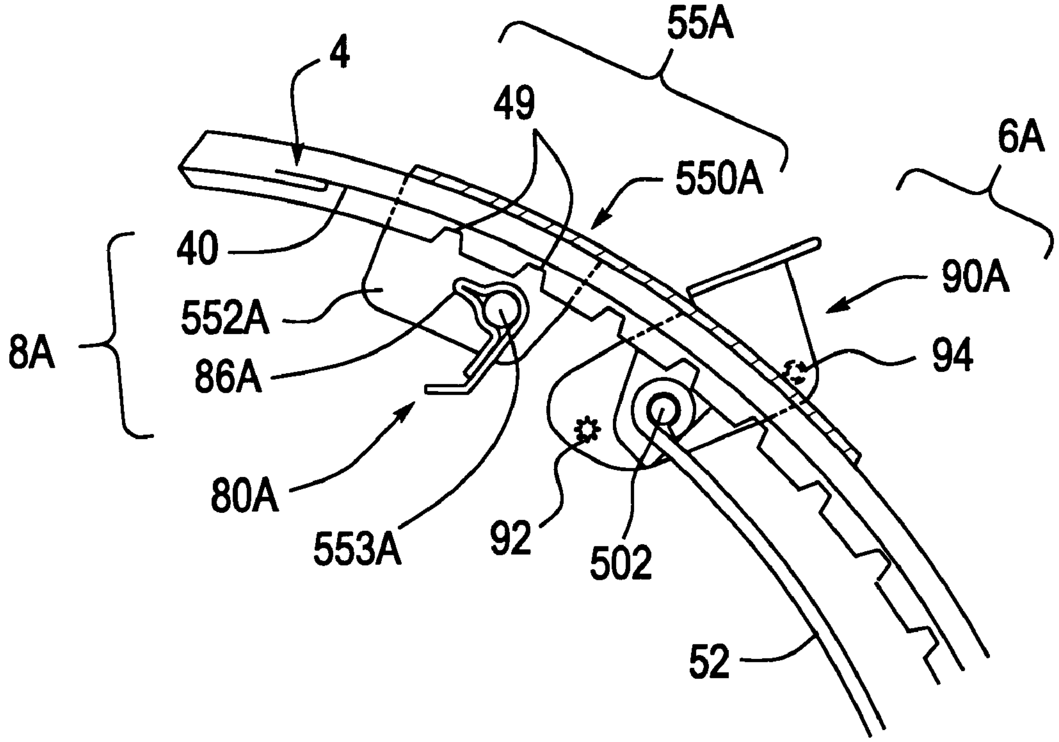
FIG. 13 is a sectional view showing a configuration of a clasp upper box of the wrist-fit-type communication device shown in FIG. 11.
Figure 14:
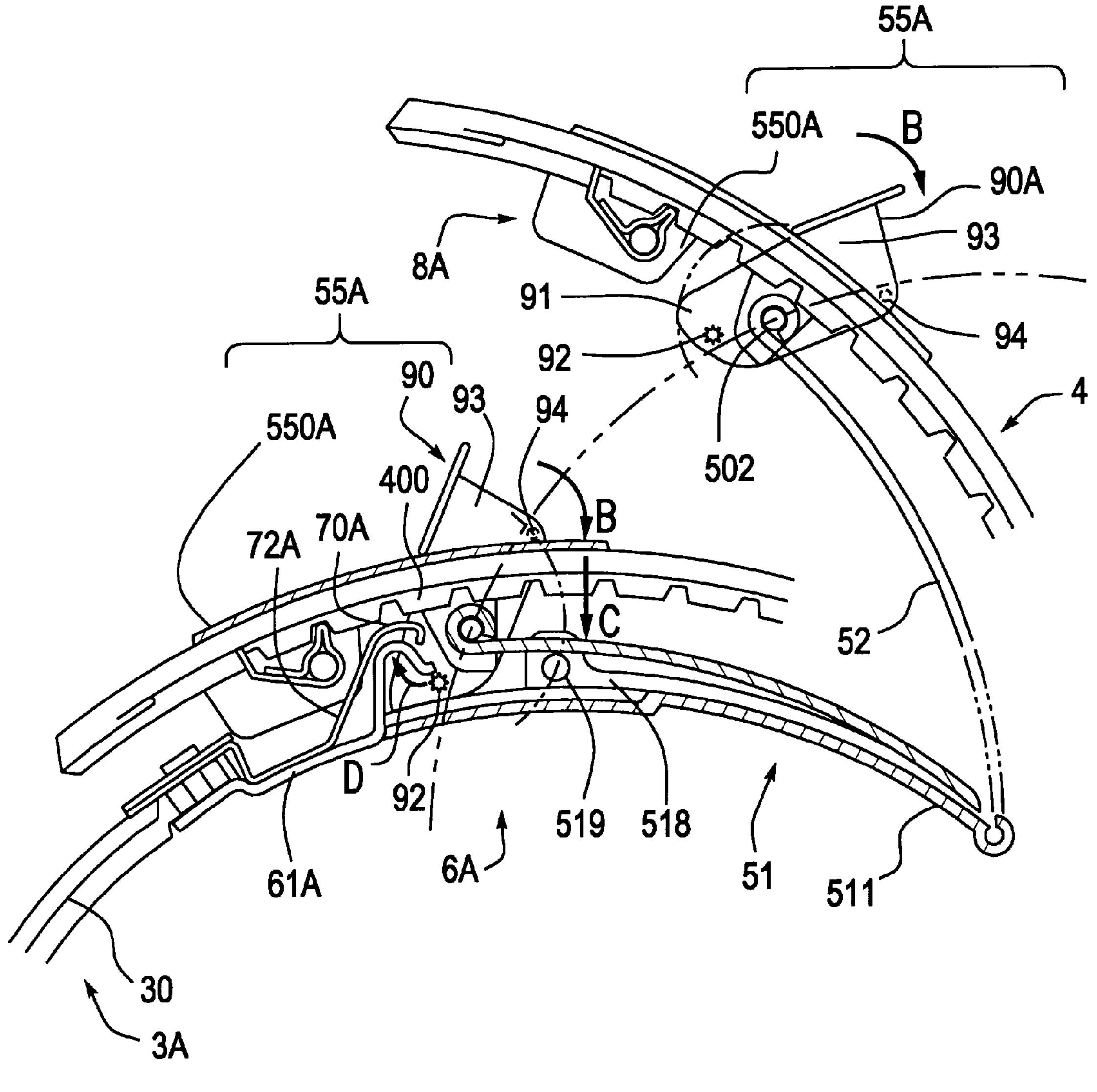
FIG. 14 is a sectional view showing a state where clasping of wrist bands are performed using the clasp device of the wrist-fit-type communication device shown in FIG. 1.
Figure 15A:
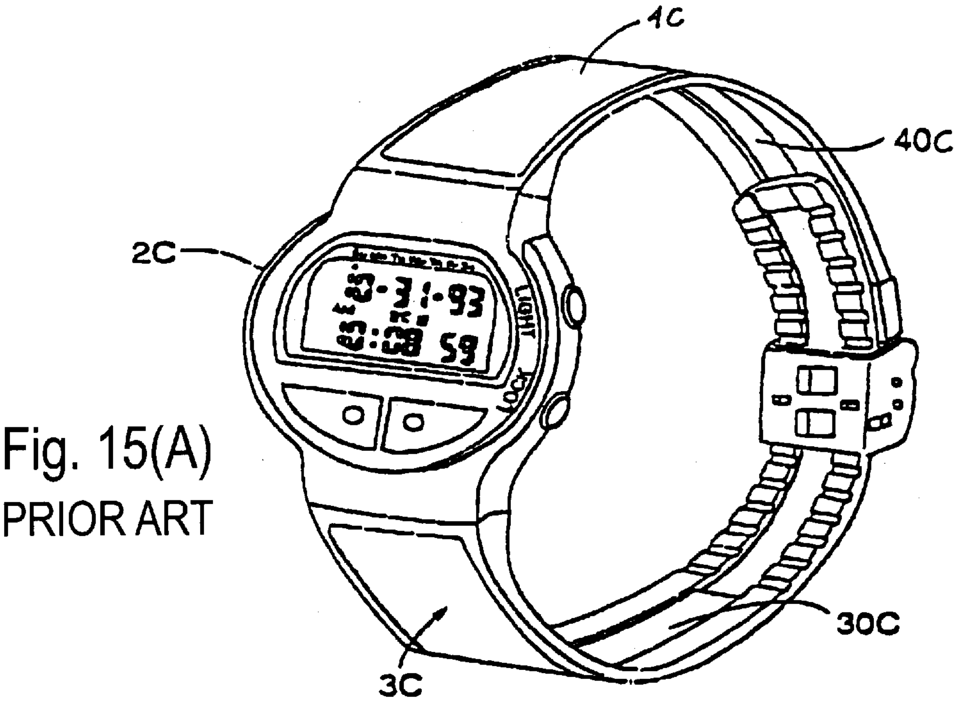
Fig. 15(A) PRIOR ART
FIG. 15 (A) is a perspective view of a conventional wrist-fit-type communication device.
FIG. 15(B) is an illustration of a clasp metal fitting.
FIG. 15(C) is another illustration of the clasp metal fitting of FIG. 15(B).
Figure 15B:
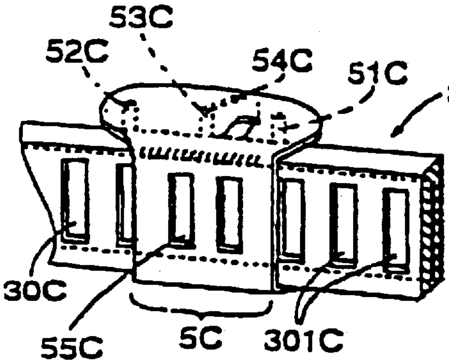
Fig. 15(B) PRIOR ART
Figure 15C:
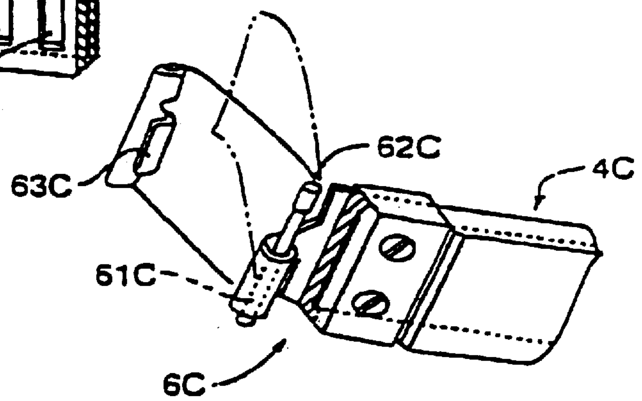
Fig. 15(C) PRIOR ART

However, the wrist-fit-type communication device 1 of this embodiment differs from the first embodiment in that an engagement plate 90 formed separately from a main body portion 550A of the clasp upper box 55A is used in the clasping lock mechanism 6A, as shown in FIGS. 13 and 14.

FIG. 13 is a sectional view showing a configuration of the clasp upper box of the wrist-fit-type communication device, and FIG. 14 is a sectional view showing a state where the clasping of the wrist bands is performed using the clasp device including the clasp upper box.

In the clasping lock mechanism 6A, a hook 61A rising from the top surface of the clasp lower plate 51 in the shape bent toward a tip portion 511 of the clasp lower plate 51, and the engagement plate 90 formed on the side of the second wrist band separately from the main body portion 550A of the clasp upper box 55, and rotatably supported around the second connecting shaft 502 are employed. The engagement plate 90 is rotatable around the axis of the second connecting shaft 502 so as to change between a diagonally raising attitude and a falling-down attitude with respect to the second wrist band 4, and fixes the clasp upper box 55A to the clasp lower box 51 by utilizing the described action.

That is, of the engagement plate 90, a lower end portion 91 located on the inner side with respect to the second wrist band 4 includes an engagement shaft 92 which enters the hook 61A, as shown by the arrow D, to be engaged with the hook 61A while the engagement plate 90 rotates around the axis of the second connecting shaft 502 with the clasp intermediate plate 52 overlapped onto the clasp lower plate 51 to be changed from the raising attitude to the falling-down attitude with respect to the second wrist band 4. Therefore, when the engagement plate 90A is to be pressed in the direction of the arrow D so as to fall down with respect to the second wrist band 4 even after the engagement shaft 92 has been engaged with the hook 61A, the force acts as a force for pressing the engagement plate 90 toward the clasp lower plate 51, as shown by the arrow C, using the engaged portion of the hook 61A and the engagement shaft 92 as a fulcrum. Here, engagement holes 519 are formed in both side surfaces 518 of the clasp lower plate 51, respectively, while engaging small projections 94 are formed inside the both side surfaces 93 of the engagement plate 90 at positions corresponding to the engagement holes 519. For this reason, as shown in FIG. 12, when both side surfaces 93 of the engagement plate 90 and both side surfaces 518 of the clasp lower plate 51 overlap, the engaging small projections 94 are fitted into the engagement holes 519. As a result, the main body portion 550A of the clasp upper box 55 is fixed to the clasp lower plate 51 through the engagement plate 90, so that the first wrist band 3 and the second wrist band 4 are clasped.

In this embodiment, as the contact mechanism 7A for electrically connecting the first antenna plate 30 and the second antenna plate 40 to form a loop-like antenna when the first wrist band 4 and the second wrist band 4 are clasped, the second antenna plate 40 is bare on the inner peripheral surface of the second wrist band 4 in the longitudinal direction, while the projecting contact portion 70A is projected on the upper surface of the clasp lower plate 51 which is electrically connected to the first antenna plate 30, similarly to the first embodiment.

In this embodiment, however, the projecting contact portion 70A is formed by processing a part of the plate spring as the contact urging spring 72A, and is raised in such a form that it covers the hook 61A from the back thereof on the side of the base end portion 510 of the clasp lower plate 51 rather than the hook 61A. The position where the projecting contact portion 70A is thus arranged does not overlap the clasp intermediate plate 52 even when the clasp intermediate plate 52 is overlapped onto the clasp lower plate 51, so that the projecting contact portion 70A elastically comes into abutment with the bare portion 400 of the second antenna plate 40 by avoiding the clasp intermediate plate 52 when the first wrist band 3 and the second wrist band 4 are clasped. As a result, the first antenna plate 30 and the second antenna plate 40 are electrically connected through the clasp lower plate 51, the contact urging spring 72A, and the projecting contact portion 70A to form a loop-like antenna. Incidentally, similarly to the first embodiment, the bare portion of the second antenna plate 40 is formed to the extent that it does not stick out of the tip side of the clasp lower plate 51 when the clasp intermediate plate 52 is overlapped onto the clasp lower plate 51, so that the skin does not touch the bare portion of the second antenna plate 40.

When the wrist-fit-type communication device 1 is removed from the wrist, the engagement plate 90 is rotated around the axis of the second connecting shaft 502 to be switched from the falling-down attitude to the diagonally raising attitude with respect to the second wrist band 4, contrary to the operation as described above. As a result, the engagement shaft 92 which has been engaged with the hook 61A disengages the hook 61A after the small projections 94 formed on both side surfaces 93 of the engagement plate 90 have got out of the engagement holes 519 formed in both side surfaces 518 of the clasp lower plate 51.

In the thus constructed wrist-fit-type communication device 1, the clasp upper box 55A also includes a clasp upper box-fixing lock mechanism 8A which can adjust a condition where the second wrist band 4 is clamped from top and bottom on the side of its main body portion 550A, and the fixed position of the clasp upper box 55A in the longitudinal direction of the second wrist band 4 by releasing this clamped condition. That is, in the clasp upper box-fixing lock mechanism 8A, a supporting shaft 553A is arranged between both side surfaces 552A of the main body portion 550A of the clasp upper box 55, and a rotary lever 80A including a fixed pawl 86A (engagement projection) is supported by the supporting shaft 553A, while a plurality of dents 49 are formed on the inner peripheral surface in the longitudinal direction of the second wrist band 4 at fixed intervals. For this reason, as shown in FIG. 13, if the clasp upper box 55A is shifted to a predetermined position in the lengthwise direction of the second wrist band 4 with the lever 80A rotated around the axis of the supporting shaft 553A to disengage the fixed pawl 86A from the dents 49 of the second wrist band 4 and thereafter, as shown in FIGS. 12 and 14, the lever 80A is rotated around the axis of the supporting shaft 553A to bring the fixed pawl 86A into engagement with the dents 49 of the second wrist band 4, the second wrist band 4 is clamped between the fixed pawl 86A and the main body portion 550A of the clasp upper box 55A, so that the clasp upper box 55A is fixed to the second wrist band 4.

Incidentally, in both of the described embodiments, the first wrist band 3 is extended from the 6 o'clock side of the device main body 2, and the second wrist band 4 is extended from the 12 o'clock side. However, in contrast with this, the first wrist band 3 may be extended from the 12 o'clock side of the device main body 2, and the second wrist band 4 may be extended from the 6 o'clock side (or any other side opposite the first band 3). In addition, it is appreciated that the constructions according to the above embodiments may be combined.

As described above, in the wrist-fit-type communication device according to the present invention, since the three fold clasp device is employed for clasping the first wrist band and the second wrist band, the first wrist band and the second wrist band are clasped after passing a wrist through a ring formed by the device main body, the first wrist band, the clasp device, and the second wrist band. Therefore, there is no inconvenience such that the wrist-fit-type communication device erroneously falls off of the wrist. Especially since the first antenna plate 30 and the second antenna plate 40 are contained, and they are covered with insulating materials, there is an advantage that the wrist bands can be easily fitted to the wrist even when the first wrist band and the second wrist band are relatively hard. In addition, if synthetic resin is employed as an insulating material for covering the antenna plates in each of the wrist bands, the wrist bands are further likely to become inflexible. However, since the three fold clasp device is adopted in the present invention, the fitting property to the wrist is high, so that the most use can be made of the advantage of using synthetic resin as insulating materials such that there is no adverse effect of using synthetic resin, and that the wrist bands can be manufactured integrally with the antenna plates. In addition, the three fold clasp device can prevent the bare portion of the second antenna plate from touching the skin. Therefore, since the bare portion of the second antenna plate is not stained by contact with the skin, there causes no poor electrical connection when the length of the band is adjusted, even if electrical connection is effected at a portion which has not been used for the electrical connection.

In addition, if the projecting contact portion is urged by the contact urging spring so as to come into abutment with the bare portion of the second antenna plate, the projecting contact portion and the second antenna plate are electrically connected with certainty even if a looseness and a reduction in dimensional accuracy are produced in any part of the clasp device.

What is claimed is:

1. A wrist band for a device main body containing communication circuits comprising:

a first wrist band at least partially covering a first antenna plate extending from a first side of the device main body;

a second wrist band at least partially covering a second antenna plate extending from a second side of the device main body;

a releasable clasp device including a contact mechanism for electrically connecting the first antenna plate and the second antenna plate to form a loop-like antenna when second wrist band and the first wrist band are clasped;

the releasable clasp device having a three fold structure including a clasp lower plate having a base end portion fixed to the first wrist band, a clasp intermediate plate connected to the clasp lower plate, a clasp upper box connected to the clasp intermediate plate and fixed to the second wrist band and a clasping lock mechanism which fixes the clasp upper box to the clasp lower plate when the clasp intermediate plate is rotated and overlapped onto the clasp lower plate; and the contact mechanism includes a bare portion of the second antenna plate on an inner peripheral surface of the second wrist band and a projecting contact portion projecting from a top surface of the clasp lower plate and electrically connected with the first antenna plate, the projecting contact portion contacting the bare portion of the second antenna plate when the first wrist band and the second wrist band are clasped.

2. A wrist band according to claim 1, wherein the intermediate plate includes a slot formed therein through which the projecting contact portion passes when the first wrist band and the second wrist band are clasped.

3. A wrist band according to claim 1, wherein the projecting contact portion is positioned to contact the bare portion of the second antenna plate without contacting the clasp intermediate plate when the first wrist band and the second wrist band are clasped.

4. A wrist band according to claim 1, wherein the projecting contact portion is urged by a contact urging spring to elastically contact the bare portion of the second antenna plate.

5. A wrist band according to claim 4, wherein the projecting contact portion is formed as a single piece with the contact urging spring.

6. A wrist band according to claim 4, wherein the upper surface of the clasp lower plate includes a protective cover for covering the contact urging spring, and wherein the projecting contact portion projects from the upper surface of the protective cover.

7. A wrist band according to claim 1, wherein the bare portion of the second antenna plate does not protrude beyond the tip side of the clasp lower plate when the clasp intermediate plate is overlapped onto the clasp lower plate.

8. A wrist band according to claim 1, wherein the clasp upper box is movable in a longitudinal direction along the second wrist band and includes a clasp upper box-fixing lock mechanism that can clamp the clasp upper box at a selected position along the second wrist band.

9. A wrist band according to claim 8, wherein the second wrist band includes a plurality of dents formed on an inner peripheral surface in the longitudinal direction at predetermined intervals, and the clasp upper box-fixing lock mechanism includes engagement projections engageable with the dents.

10. A wrist band according to claim 9, wherein the clasp upper box includes index marks for aligning the engagement projections with selected ones of the dents.

11. A according to claim 1, wherein the clasp upper box-fitting lock mechanism and a portion of the clasping lock mechanism are formed as a single piece.

12. A wrist band according to claim 1, wherein the clasping lock mechanism has a hook extending from the top surface of the clasp lower plate and an engagement piece on the lower surface of the clasp upper box that automatically engages the hook with elasticity due to action of engaging springs when the clasp upper box is pressed toward the clasp lower plate with the clasp intermediate plate overlapped onto the clasp lower plate, and wherein the engagement piece is displaced against the action of the engaging springs to disengage the engagement piece from the hook when a user performs a release operation.

13. A wrist band according to claim 12, wherein the engagement piece includes two engagement plates having outer end portions projecting from opposite sides of both side surfaces of the clasp upper box, and inner end portions each passing around from the outer end portions to an opposite side of the hook to be engaged with the hook at the opposite side, and wherein the two engagement plates are urged by the engaging springs toward the respective outer end portions, and wherein the inner end portions are elastically engaged with the hook, displaced against urging forces of the engaging springs when the outer end portions are pressed by both side surfaces of the clasp upper box and disengaged from the hook.

14. A wrist band according to claim 13, wherein the inner end portions are constructed so as to pass around to the opposite side of the hook in the reverse direction to each other, whereby the two engagement plates are substantially co-planar and do not overlap.

15. A wrist band according to claim 1, wherein the clasping lock mechanism has a hook extending from the top surface of the clasp lower plate in a shape bent toward the tip portion of the clasp lower plate, and an engagement plate formed on the side of the second wrist band separately from a main body portion of the clasp upper box and rotatably supported on a connecting shaft, and wherein the engagement plate includes an engagement shaft which engages the hook when the engagement plate is rotated around the axis of the second connecting shaft with the clasp intermediate plate overlapped onto the clasp lower plate, and is lowered from a raised position to a lowered position with respect to the second wrist band, and wherein the engagement plate includes engaging projections that engage holes formed in both side surfaces of the clasp lower plate when the engagement plate is pressed toward the clasp lower plate using the engaged portion of the engagement shaft and the hook as a fulcrum after the engagement shaft has been engaged with the hook.

16. A wristband communication device comprising:

a device main body containing a communication circuit;

a first wrist band at least partially covering a first antenna plate extending from a first side of the device main body;

a second wrist band at least partially covering a second antenna plate extending from a second side of the device main body; and a clasp device including a contact mechanism for electrically connecting the first antenna plate and the second antenna plate to form an antenna when the first wrist band and the second wrist band are clasped, wherein the clasp device is releasable and has a three-fold structure including a clasp lower plate having a base end portion fixed to the first wristband, a clasp intermediate plate connected to the clasp lower plate, a clasp upper box connected to the clasp intermediate plate and fixed to the second wrist band and a clasping lock mechanism that locks the clasp upper box to the clasp lower plate when the clasp intermediate plate is rotated and overlapped onto the clasp lower plate, and wherein the contact mechanism includes a bare portion of the second antenna plate, a projecting contact portion projecting from a top surface of the clasp lower plate and electrically connected with the first antenna plate that contacts the bare portion of the second antenna plate without contacting the clasp intermediate plate when the first wrist band and the second wrist band are clasped.

17. A method for making a wrist band for a main body containing communications circuits, comprising:

making a first wrist band at least partially covering a first antenna plate extending from a first side of the device main body;

making a second wrist band at least partially covering a second antenna plate extending from a second side of the device main body; making a releasable clasp device including a contact mechanism for electrically connecting the first antenna plate and the second antenna plate to form a loop-like antenna when second wrist band and the first wrist band are clasped;

the releasable clasp device having a three fold structure including a clasp lower plate having a base end portion fixed to the first wrist band, a clasp intermediate plate connected to the clasp lower plate, a clasp upper box connected to the clasp intermediate plate and fixed to the second wrist band and a clasping lock mechanism which fixes the clasp upper box to the clasp lower plate when the clasp intermediate plate is rotated and overlapped onto the clasp lower plate; and the contact mechanism having a bare portion of the second antenna plate on an inner peripheral surface of the second wrist band and a projecting contact portion projecting from a top surface of the clasp lower plate and electrically connected with the first antenna plate, the projecting contact portion contacting the bare portion of the second antenna plate when the first wrist band and the second wrist band are clasped.

* * * * *